US008013767B2

United States Patent
Nentwig

(10) Patent No.: US 8,013,767 B2
(45) Date of Patent: Sep. 6, 2011

(54) ANALOGUE-TO-DIGITAL CONVERTER (ADC) DYNAMIC RANGE AND GAIN CONTROL

(75) Inventor: Markus Nentwig, Helsinki (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 12/530,071

(22) PCT Filed: Mar. 3, 2008

(86) PCT No.: PCT/EP2008/052576
§ 371 (c)(1),
(2), (4) Date: Sep. 30, 2009

(87) PCT Pub. No.: WO2008/107421
PCT Pub. Date: Sep. 12, 2008

(65) Prior Publication Data
US 2010/0079321 A1    Apr. 1, 2010

(30) Foreign Application Priority Data
Mar. 6, 2007  (GB) .................................. 0704328.4

(51) Int. Cl.
H03M 1/62    (2006.01)
H03M 1/84    (2006.01)

(52) U.S. Cl. ....................................... 341/139; 341/155
(58) Field of Classification Search .................. 341/155, 341/139; 330/127
See application file for complete search history.

(56) References Cited

U.S. PATENT DOCUMENTS

| 6,993,291 B2 | 1/2006 | Parssinen et al. |
| 7,701,376 B2 * | 4/2010 | Oshima et al. ................ 341/159 |
| 2002/0142745 A1 | 10/2002 | Kang et al. |
| 2006/0052070 A1 | 3/2006 | Jin et al. |
| 2006/0222116 A1 | 10/2006 | Hughes et al. |
| 2009/0207311 A1 * | 8/2009 | Fu et al. ....................... 348/678 |

FOREIGN PATENT DOCUMENTS
WO   WO2006/099530 A   9/2006

OTHER PUBLICATIONS
International Search Report, PCT/EP2008/052576, dated Jun. 16, 2008.

* cited by examiner

*Primary Examiner* — Peguy JeanPierre
(74) *Attorney, Agent, or Firm* — Alston & Bird LLP

(57) ABSTRACT

The present invention relates to a method for using the peak-to-average power ratio (PAR) of signals received by a receiver to control the gain of the receiver for an analogue-to-digital converter (ADC) and/or to control the dynamic range of the ADC.

28 Claims, 5 Drawing Sheets

ANALOGUE-TO-DIGITAL CONVERTER (ADC) DYNAMIC RANGE AND GAIN CONTROL

FIELD OF THE INVENTION

The present invention is related to processing a received signal using an analogue-to-digital converter (ADC), and more particularly, to controlling the gain of a receiver for the ADC or controlling the dynamic range of the ADC.

BACKGROUND

Radio receivers process received signals to extract wanted signals. The antenna for a radio receiver receives signals across the spectrum in a wide bandwidth, including the wanted signal and possibly unwanted signals. The receiver can use filters to reduce the level of unwanted signals that appear outside the frequency range of the wanted signal.

The receiver can use an analogue-to-digital converter (ADC). The digitised signal may then be used by a digital processor of the receiving device. The digitised signal may contain communications such as voice communications, email communications, or text communications.

The analogue-to-digital converter converts the signal from an analog voltage or current into a digital representation. By necessity the ADC has a limited digital range. An instantaneous voltage or current with higher amplitude than the maximum value allowed by the ADC is clipped. Clipping is an undesirable outcome. Further, the ADC component introduces unwanted noise. A wanted signal too low in amplitude has its signal-to-noise ratio reduced by the ADC noise.

To ensure that the noise introduced by the ADC does not deteriorate the signal-to-noise ratio of the wanted signal below a minimum value, the receiver must amplify or attenuate the received signal by an amount that depends both on the power of the wanted signal, and the noise floor of the ADC.

The received signal can contain a wanted signal, and one or more unwanted signals. In the most critical case, the power of the unwanted signals is significantly higher than the power of the wanted signal. Further, the frequency difference between wanted and unwanted signals is small, preventing effective removal of the unwanted signals by filtering prior to the ADC. It follows, that the unwanted signal appears at the input of the ADC with a power that is still considerably higher than the wanted signal. To prevent clipping distortion caused by the unwanted signal in the ADC, the prior amplification or attenuation of the signal must be chosen in such a way by an analog gain control algorithm (AGC), that the unwanted signal never exceeds the clipping level of the ADC.

Existing methods include choosing the gain or attenuation prior to the ADC in such a way, that a substantial margin between the power of the received signal and the clipping level of the ADC is maintained (headroom). The ADC can be switched to a higher performance mode, when the presence of blockers is detected. Further, a filter with high selectivity may be used to achieve sufficient rejection of unwanted signals prior to the ADC. The main disadvantage of these methods is that better performance is required from ADC and filters, leading to increased cost due to larger integrated circuit size and increased power consumption. Further, the achieved signal-to-noise ratio may be suboptimal, possibly reducing system throughput.

There is a desire for an improved method of controlling gain and ADC dynamic range in a radio receiver.

It is an object of the present invention to provide a method of controlling the gain of a receiver for an ADC or controlling the dynamic range of the ADC to ensure that received signals are optimally processed, or to at least provide a useful alternative.

SUMMARY OF INVENTION

According to a first aspect of the invention there is provided a method of processing a signal, comprising:
  determining average power of the signal;
  determining peak-to-average power ratio (PAR) of the signal;
  amplifying the signal based at least in part on the PAR in conjunction with the average power; and
  converting the amplified signal from analogue into digital.

The PAR may be determined at least in part by detecting whether the signal is unwanted. The signal may be detected as unwanted based at least in part on the strength of the received signal, the average power over a wide frequency band, and/or on monitoring a narrow frequency band where unwanted signals are likely to appear.

Alternatively the PAR may be determined by using a peak detector.

According to a further aspect of the invention there is provided a method of processing a signal, comprising:
  determining average power of the signal;
  determining peak-to-average power ratio (PAR) of the signal;
  configuring a dynamic range for an analogue-to-digital converter based at least in part on the PAR in conjunction with the average power; and
  converting the signal from analogue into digital using the analogue-to-digital converter.

According to a further aspect of the invention there is provided a signal processing apparatus, comprising:
  a processing component arranged for determining an average power of
  a signal;
  a processing component arranged for determining a peak-to-average power ratio (PAR) of a signal;
  an amplification component arranged for amplifying a signal based on a determined peak-to-average power ratio (PAR) in conjunction with a determined average power; and
  an analogue to digital converter arranged for converting an amplified signal from analogue form into digital form.

According to a further aspect of the invention there is provided a signal processing apparatus, comprising:
  a processing component arranged for determining an average power of
  a signal;
  a processing component arranged for determining a peak-to-average power ratio (PAR) of a signal; and
  an analogue to digital converter comprising a dynamic range configured at least in part using the peak-to-average power ratio in conjunction with the average power of a signal, and arranged for converting a signal from analogue form into digital form.

BRIEF DESCRIPTION OF THE DRAWINGS

Embodiments of the invention will now be described, by way of example only, with reference to the accompanying drawings in which.

DETAILED DESCRIPTION OF PREFERRED EMBODIMENTS

The present invention relates to a method for controlling the gain for, or the dynamic range of, the analogue-to-digital converter (ADC) of a receiver using the peak-to-average power ratio (PAR) of signals.

The average power of signals received by the radio receiver can be determined using root-means-square (RMS) of the signal.

Some signals have a large peak-to-average power ratio (PAR). This means that when the gain of the amplifier is based on the average power of the signal, it must be adjusted with regard to a maximum possible PAR to ensure that the peaks of the received signals do not exceed the range of the ADC.

Figure 1:
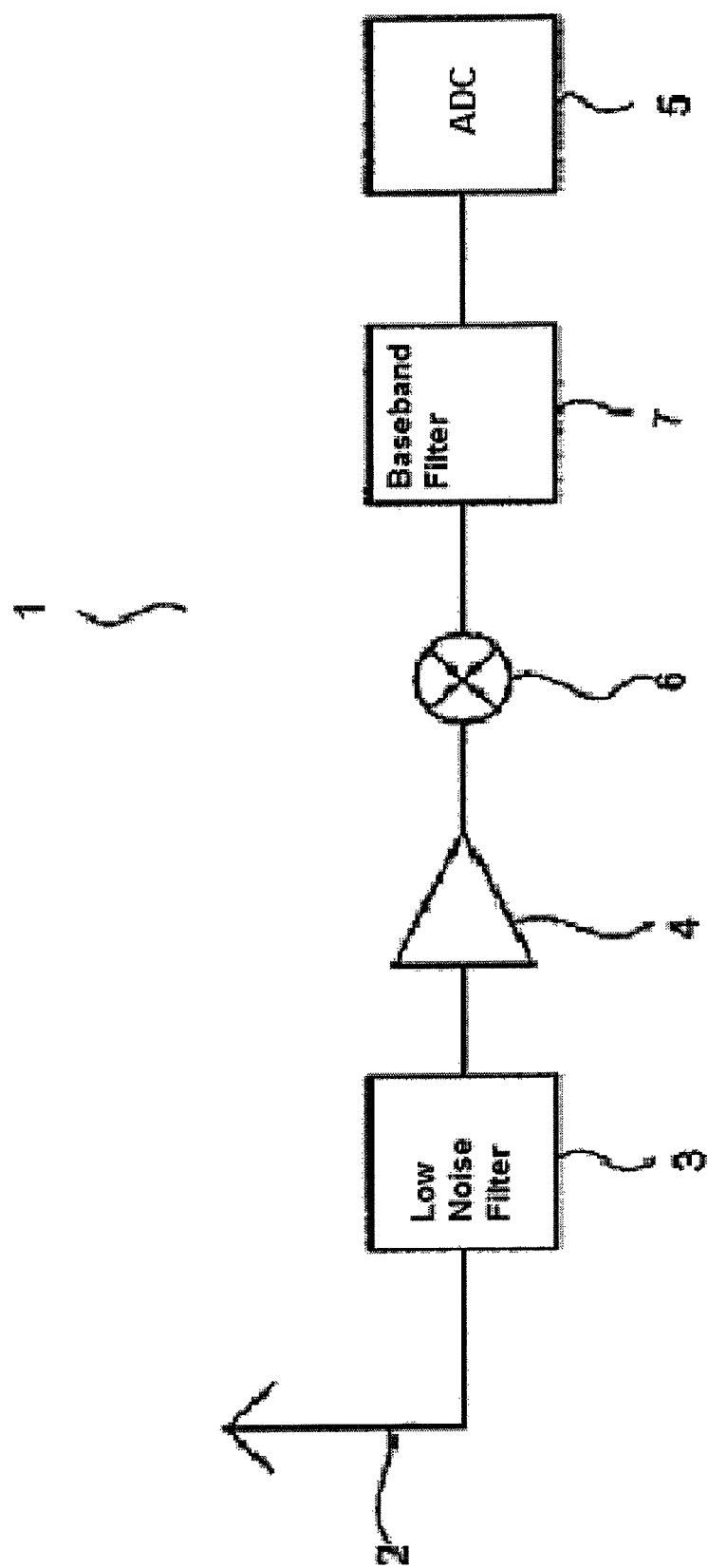
FIG. 1: shows a schematic diagram illustrating the front end of a receiver.

FIG. 1 shows the front end 1 for a receiver.

An antenna 2 receives signals and provides them to a band select filter 3.

The band select filter 3 provides a signal within a frequency band to a low noise amplifier 4 which amplifies the signal to ensure wanted signals are above the noise floor of the analogue-to-digital converter (ADC) 5.

The amplifier 4 is controlled by a gain control algorithm.

It will be appreciated that other components may perform the function of a variable amplifier such as a mixer 6 and analogue baseband filter 7.

The result of the amplifier 4 is mixed in a mixer 6.

The result of the mixer 6 is filtered by an analogue baseband filter 7.

The amplified, mixed, and filtered signal is provided to the ADC 5 for conversion into digital.

Figure 2:
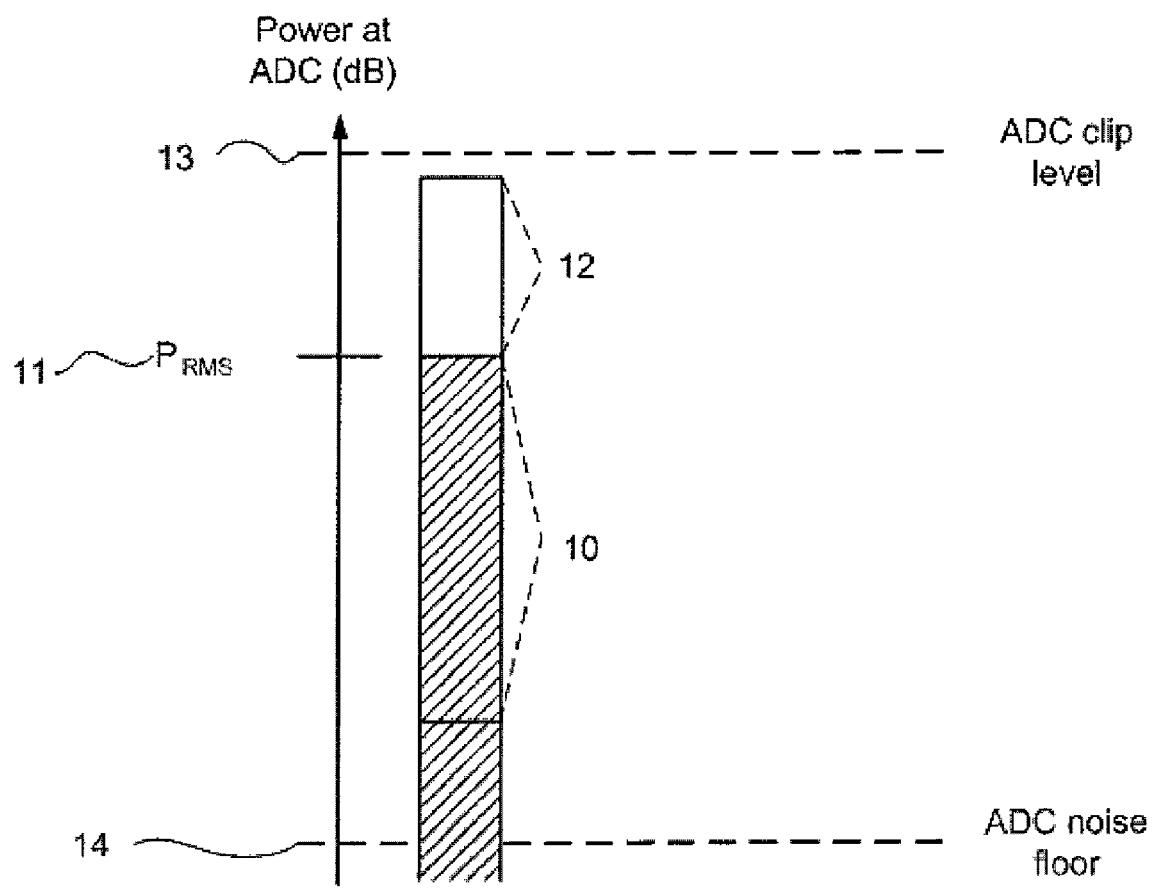
FIG. 2: shows a diagram illustrating a wanted signal being received at an ADC.

FIG. 2 shows a graph where a wanted signal 10 is being received.

The gain control algorithm uses a calculation of the average power (RMS) 11 of the signal to control the gain on the amplifier to amplify the received signal. However, the gain control algorithm does not factor in instantaneous peaks in received signal and therefore must also leave "headroom" 12 above the average power to prevent instantaneous peaks causing the signal to go beyond the clip level 13 of the ADC.

In the example shown the wanted signal has been amplified by the gain control algorithm above the noise floor 14 of the ADC.

Figure 3:
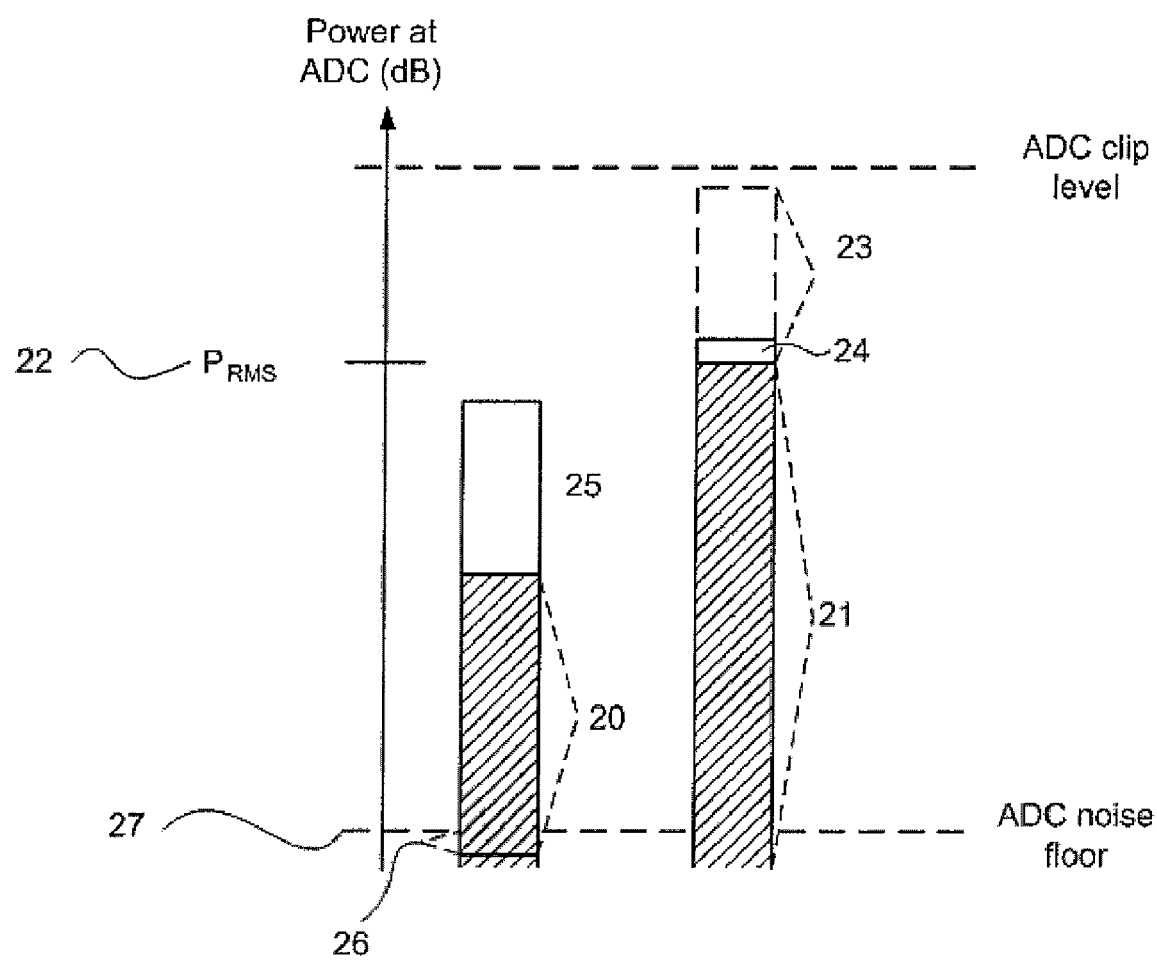
FIG. 3: shows a diagram illustrating a wanted signal and an unwanted signal received at an ADC.

FIG. 3 shows a graph where a wanted signal 20 and an unwanted signal 21 are both being received.

The gain control algorithm does not distinguish between wanted signals and unwanted signals. Therefore, using the average power (RMS) 22 of the signal which is inflated by the powerful unwanted signal, the gain control algorithm amplifies the signal less than the previous example. The gain control algorithm also leaves "headroom" 23. However, in this example, the peak-to-average ratio of the unwanted signal 24 is substantially less than the peak-to-average ratio 25 for wanted signals. Therefore a portion of the range of the ADC is unused. For some wanted signals, this can result in a part of the wanted signal 26 falling below the noise floor 27.

Figure 4:
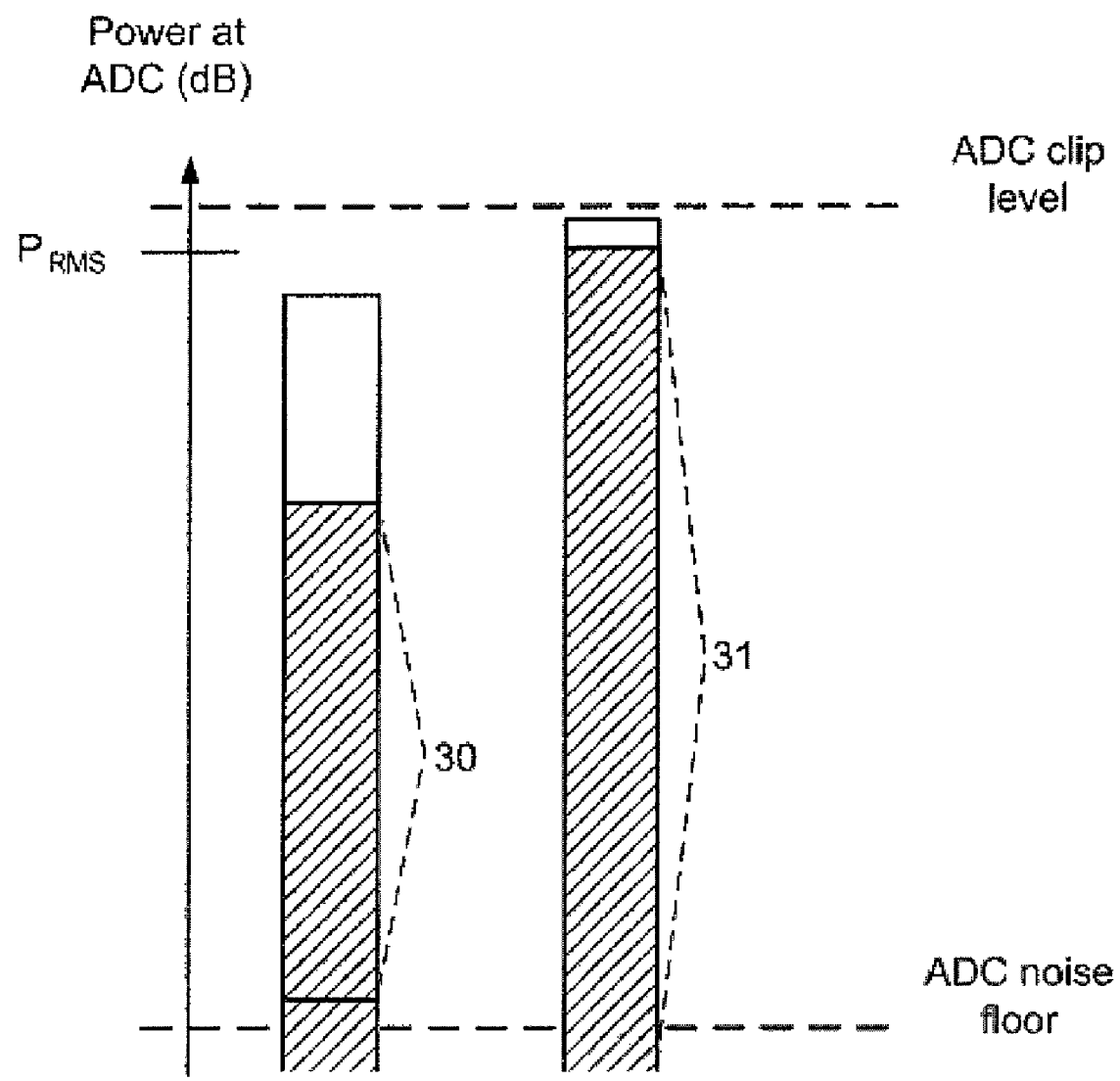
FIG. 4: shows a diagram illustrating a wanted signal and an unwanted signal received at an ADC in accordance with an embodiment of the invention.

FIG. 4 shows a graph where a wanted signal 30 and an unwanted signal 31 are being received, and the gain of the signal is controlled in accordance with an embodiment of the invention.

The inventors have observed that that for some implementations, such as where the wanted signal carries orthogonal frequency division multiplex (OFDM) modulation, most wanted signals have a high PAR and most unwanted signals have a low PAR.

A method of the invention will now be described which determines the PAR of the received signal and modifies the gain of the amplifier based on the average power of the signal in conjunction with the determined PAR to obtain a more efficient use of the ADC.

For example, if a strong unwanted signal and a wanted signal are being contemporaneously received the invention may determine that the PAR of the overall received signal is low. Therefore the gain of the amplifier can be increased beyond the maximum gain to avoid clipping within the ADC for another signal with the same average power but a higher PAR.

The PAR may be determined by detecting that an unwanted signal is being received and setting the PAR to be low. An unwanted signal may be detected by the strength of the received signal (for example, if the power of the received signal is beyond a certain threshold then the received signal is likely to contain an unwanted signal), by monitoring the average power over the wide frequency band (for example, high average power indicates an unwanted signal) and/or by monitoring a narrow frequency band where unwanted signals often appear.

Alternatively, the PAR may be determined by a peak detector.

In an alternative embodiment where a variable ADC is used, instead of modifying the gain for the ADC, the dynamic range of the ADC may be modified based on the average power of the signal in conjunction with the determined PAR.

Figure 5:
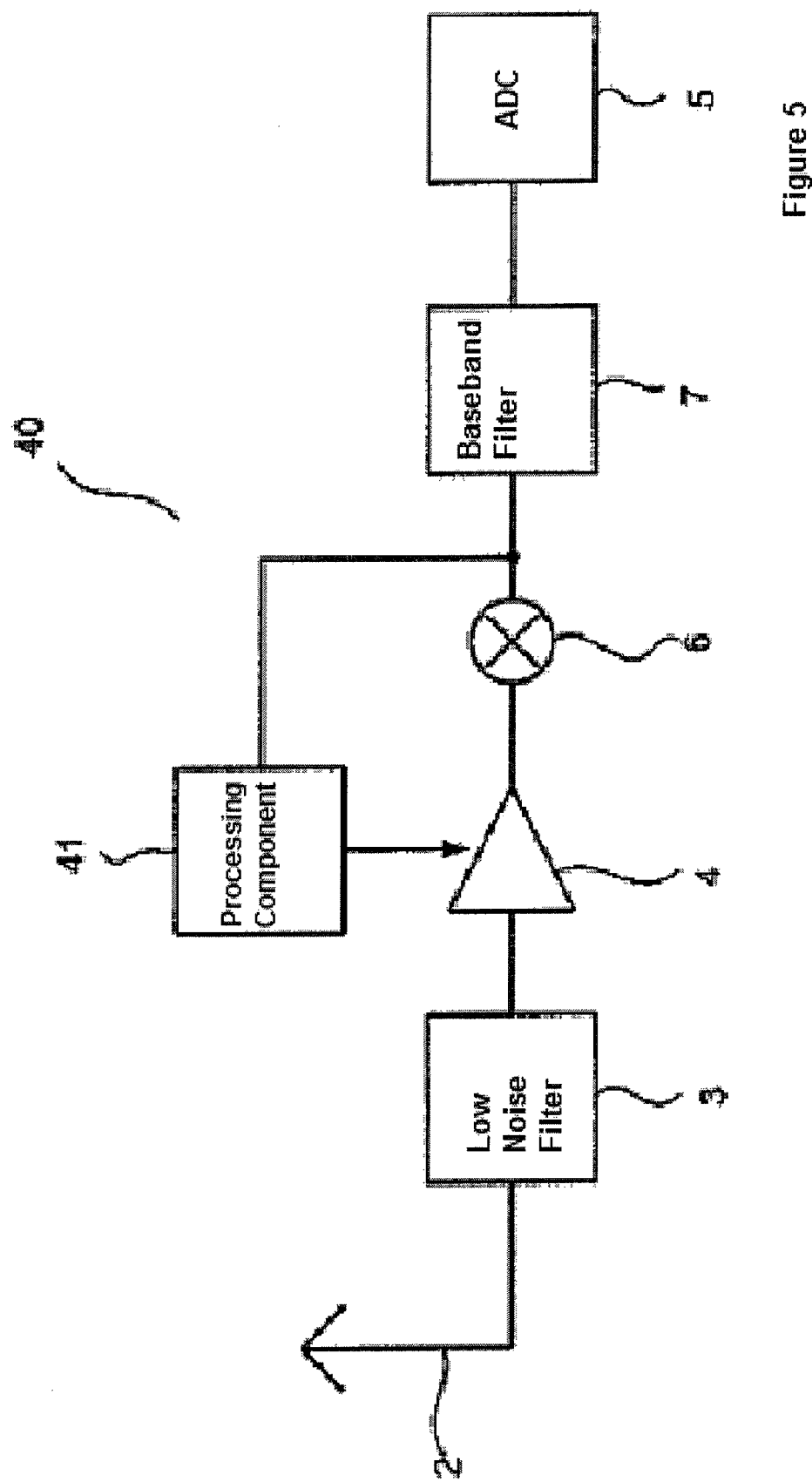
FIG. 5: shows a schematic diagram illustrating the front end of a receiver including a signal processing apparatus in accordance with an embodiment of the invention.

FIG. 5 shows the front end 40 for a receiver including a signal processing apparatus in accordance with an embodiment of the invention.

The front end may include the same components as shown in FIG. 1.

The signal processing apparatus may include a processing component 41. In this embodiment the processing component 41 receives an input from the mixer 6. The processing component 41 may receive inputs from a peak detector, a narrowband detector, a wideband average power detector, or the band select filter 3 in addition to or instead of the mixer 6.

The processing component 41 may calculate the average power of the signal and may determine the peak-to-average power ratio (PAR) in accordance with aspects of the invention already disclosed.

The processing component 41 may then use the PAR in conjunction with the average power of the signal to control the variable gain of the amplifier 4.

In an alternative embodiment the processing component 41 controls the dynamic range of the ADC 5.

The receiver including a signal processing apparatus of the invention may be used as a receiver for a mobile cellular device.

Embodiments of the present invention provide for improved reception of a wanted signal in the presence of unwanted signals.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

The invention claimed is:

1. A method of processing a signal, comprising:
    determining average power of the signal;
    determining peak-to-average power ratio (PAR) of the signal;
    amplifying the signal based at least in part on the PAR in conjunction with the average power; and
    converting the amplified signal from analogue into digital.

2. A method as claimed in claim 1 wherein the PAR is determined at least in part by detecting whether the signal is unwanted.

3. A method as claimed in claim 2 wherein the signal is detected as unwanted based at least in part on the strength of the received signal.

4. A method as claimed in claim 1 wherein the signal is detected as unwanted based at least in part on the average power over a wide frequency band.

5. A method as claimed in claim 1 wherein the signal is detected as unwanted based at least in part on monitoring a narrow frequency band where unwanted signals are likely to appear.

6. A method as claimed in claim 1 wherein the PAR is determined by using a peak detector.

7. A method of processing a signal, comprising:
    determining average power of the signal;
    determining peak-to-average power ratio (PAR) of the signal;
    configuring a dynamic range for an analogue-to-digital converter based at least in part on the PAR in conjunction with the average power; and
    converting the signal from analogue into digital using the analogue-to-digital converter.

8. A method as claimed in claim 7 wherein the PAR is determined at least in part by detecting whether the signal is unwanted.

9. A method as claimed in claim 8 wherein the signal is detected as unwanted based at least in part on the strength of the received signal.

10. A method as claimed in claim 8 wherein the signal is detected as unwanted based at least in part on the average power over a wide frequency band.

11. A method as claimed in claim 8 wherein the signal is detected as unwanted based at least in part on monitoring a narrow frequency band where unwanted signals are likely to appear.

12. A method as claimed in claim 7 wherein the PAR is determined by using a peak detector.

13. A signal processing apparatus, comprising:
    a processing component arranged for determining an average power of a signal;
    a processing component arranged for determining a peak-to-average power ratio (PAR) of a signal;
    an amplification component arranged for amplifying a signal based on a determined peak-to-average power ratio (PAR) in conjunction with a determined average power; and
    an analogue to digital converter arranged for converting an amplified signal from analogue form into digital form.

14. A signal processing apparatus as claimed in claim 13 wherein the amplification component comprises a mixer and an analog filter.

15. A signal processing apparatus as claimed in claim 13 wherein the amplification component comprises an amplifier.

16. A signal processing apparatus as claimed in claim 13 wherein the processing component is arranged for determining the PAR at least in part by detecting whether the signal is unwanted.

17. A signal processing apparatus as claimed in claim 16 wherein the signal is detected as unwanted based at least in part on the strength of the received signal.

18. A signal processing apparatus as claimed in claim 16 wherein the signal is detected as unwanted based at least in part on the average power over a wide frequency band.

19. A signal processing apparatus as claimed in claim 16 wherein the signal is detected as unwanted based at least in part on monitoring a narrow frequency band where unwanted signals are likely to appear.

20. A signal processing apparatus as claimed in claim 13 wherein the processing component further comprises a peak detector arranged for determining the PAR.

21. A signal processing apparatus, comprising:
    a processing component arranged for determining an average power of a signal;
    a processing component arranged for determining a peak-to-average power ratio (PAR) of a signal;
    and
    an analogue to digital converter comprising a dynamic range configured at least in part using the peak-to-average power ratio in conjunction with the average power of the signal, and arranged for converting a signal from analogue form into digital form.

22. A signal processing apparatus as claimed in claim 21 wherein the processing component is arranged for determining the PAR at least in part by detecting whether the signal is unwanted.

23. A signal processing apparatus as claimed in claim 22 wherein the signal is detected as unwanted based at least in part on the strength of the received signal.

24. A signal processing apparatus as claimed in claim 22 wherein the signal is detected as unwanted based at least in part on the average power over a wide frequency band.

25. A signal processing apparatus as claimed in claim 22 wherein the signal is detected as unwanted based at least in part on monitoring a narrow frequency band where unwanted signals are likely to appear.

26. A signal processing apparatus as claimed in claim 21 wherein the processing component further comprises a peak detector arranged for determining the PAR.

27. A receiver comprising a signal processing apparatus, comprising:
    a processing component arranged for determining an average power of a signal;
    a processing component arranged for determining a peak-to-average power ratio (PAR) of a signal;
    an amplification component arranged for amplifying a signal based on a determined peak-to-average power ratio (PAR) in conjunction with a determined average power; and
    an analogue to digital converter arranged for converting an amplified signal from analogue form into digital form.

28. A user equipment comprising a receiver as claimed in claim 27.

* * * * *